(12) United States Patent
Lee et al.

(10) Patent No.: US 9,305,775 B2
(45) Date of Patent: Apr. 5, 2016

(54) FABRICATION METHOD OF SEMICONDUCTOR MEMORY DEVICE

(71) Applicant: SK hynix Inc., Gyeonggi-do (KR)

(72) Inventors: Young Ho Lee, Gyeonggi-do (KR); Keum Bum Lee, Gyeonggi-do (KR); Min Yong Lee, Gyeonggi-do (KR); Hyung Suk Lee, Gyeonggi-do (KR); Seung Beom Baek, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/668,330

(22) Filed: Mar. 25, 2015

(65) Prior Publication Data

US 2015/0200088 A1 Jul. 16, 2015

Related U.S. Application Data

(62) Division of application No. 13/713,534, filed on Dec. 13, 2012, now Pat. No. 9,018,612.

(30) Foreign Application Priority Data

Aug. 24, 2012 (KR) ........................ 10-2012-0093197

(51) Int. Cl.
| | | |
|---|---|---|
| H01L 29/02 | (2006.01) | |
| H01L 21/02 | (2006.01) | |
| H01L 29/36 | (2006.01) | |
| H01L 29/66 | (2006.01) | |
| H01L 29/868 | (2006.01) | |
| H01L 27/24 | (2006.01) | |
| H01L 21/22 | (2006.01) | |
| H01L 29/161 | (2006.01) | |

(52) U.S. Cl.
CPC ...... *H01L 21/0257* (2013.01); *H01L 21/02373* (2013.01); *H01L 21/02378* (2013.01); *H01L 21/02381* (2013.01); *H01L 21/02433* (2013.01); *H01L 27/2409* (2013.01); *H01L 29/36* (2013.01); *H01L 29/66121* (2013.01); *H01L 29/868* (2013.01); *H01L 21/2205* (2013.01); *H01L 29/161* (2013.01)

(58) Field of Classification Search
CPC ......... H01L 45/04; H01L 29/00; H01L 27/24; G11C 13/0004
USPC .................. 257/1–5, E29.002; 438/102–104; 365/163
See application file for complete search history.

(56) References Cited

U.S. PATENT DOCUMENTS

2003/0052721 A1* 3/2003 Chaudhry ......... H01L 21/82285 327/242

* cited by examiner

*Primary Examiner* — Jami M Valentine
(74) *Attorney, Agent, or Firm* — IP & T Group LLP

(57) ABSTRACT

An access device having a reduced height and capable of suppressing leakage current, a method of fabricating the same, and a semiconductor memory device including the same, are provided. The access device may include a stacked structure including a first-type semiconductor layer having a first dopant, a second-type semiconductor layer having a second dopant, and a third-type semiconductor layer. A first counter-doping layer, having a counter-dopant to the first dopant, is interposed between the first-type semiconductor layer and the third-type semiconductor layer. A second counter-doping layer, having a counter-dopant to the second dopant, is interposed between the third-type semiconductor layer and the second-type semiconductor layer.

9 Claims, 7 Drawing Sheets

FABRICATION METHOD OF SEMICONDUCTOR MEMORY DEVICE

CROSS-REFERENCES TO RELATED APPLICATION

This application is a division of U.S. patent application Ser. No. 13/713,534 filed on Dec. 13, 2012, which claims priority under 35 U.S.C. 119(a) to Korean application number 10-2012-0093197, filed on Aug. 24, 2012, in the Korean Patent Office. The disclosure of each of the foregoing application is incorporated by reference in its entirety.

BACKGROUND OF THE INVENTION

1. Technical Field

The inventive concept relates to a semiconductor integrated device, and more particularly, to an access device, a method of fabricating the same, and a semiconductor memory device having the same.

2. Related Art

Recently, resistive memory devices have received attention as nonvolatile memory devices that can replace flash memories. Typical resistive memory devices may include phase-change RAMs (PCRAMs) or resistive RAMs (ReRAMs) memory devices and may have a structure that selects an individual memory cell using an access device, such as a cell switching device.

With high integration of memory devices, a size of the access device is reduced and thus, resistances of a word line and a bit line and resistance of the access device itself are increased to cause shortage of an operation current. Therefore, an access device with high performance and high integration is needed.

In the conventional art, a MOS transistor or bipolar transistor may be used as the access device. However, a vertical diode is mainly used as the access device to meet high integration.

In the general PCRAMs, a word line is formed of an N+ type junction region that is used as one electrode of the diode and a single crystalline silicon region is formed on the word line by a selective epitaxial growth method that is used as the other electrode of the diode. However, with a reduction in size of the semiconductor memory device, resistance in the word line using the N+ type junction region is increased and a characteristic of the diode may be degraded. To solve this problem, a word line contact is formed in units of predetermined cells to reduce the resistance of the word line, but the word line contact hinders high integration.

A structure, in which a word line is formed of a metal layer and a polysilicon diode is formed on the metal layer, has been studied using an improved method.

FIG. 1 is a view showing a structure of a conventional access device and shows an example of a polysilicon diode.

An access device 100 illustrated in FIG. 1 includes a first-type semiconductor layer 101, a second-type semiconductor layer 103, and a third-type semiconductor layer 105. Here, the first-type semiconductor layer 101 may be an N+ type ion doped region and the second-type semiconductor layer 103 may be a P+ type ion doped region. The third-type semiconductor layer 105 may be a high resistance region, for example, an intrinsic semiconductor layer. Further, a heat treatment is performed to activate dopants after the second-type semiconductor layer 103 is formed.

Conventionally, a process of patterning the layers into a pillar-type has to be performed. However, the diode may collapse during an etching process or a cleaning process due to a high aspect ratio, thus reducing the yield. The aspect ratio has to be reduced to prevent the collapse of the diode and thus, a height of the polysilicon layer serving as the diode has to be lowered.

Referring to FIG. 1, ions doped into the first-type semiconductor layer 101 and the second-type semiconductor layer 103 are diffused into the third-type semiconductor layer 105 in a subsequent heat treatment process. It can be seen from the dopant diffusion profile that the first-type ions are deeply diffused into the third-type semiconductor layer 105, as shown by profile B1 and that the second-type ions are deeply diffused into the third-type semiconductor layer 105, as shown by profile A1.

An off-current characteristic of the diode tends to improve as the height of the third-type semiconductor layer 105 increases. However, when the dopants are deeply diffused, above a preset depth, from the first-type and the second-type semiconductor layers 101 and 103 into the third-type semiconductor layer 105, the actual height of the third-type semiconductor layer 105 is reduced not to ensure a desired diode characteristic.

Therefore, in the current PIN diode, the third-type semiconductor layer has to be formed to have a sufficient height and thus, the total height of the diode 100 is increases and the yield is degrades due to a collapse of the diode in a subsequent process.

However, when the height of the polysilicon layer is lowered to solve the issue of the high aspect ratio of the diode, the dopants may be diffused passing through the third-type semiconductor layer 105 due to a thermal effect caused in a subsequent process and the current leakage characteristic in a reverse bias may be degraded. Therefore, when the height of the diode is reduced, a concentration of the dopant injected to the diode has to be maintained blow a predetermined level to suppress the dopant diffusion due to the thermal effect in a subsequent process.

When the concentration of the dopant injected into the diode is low, an on-current characteristic of the diode may be degraded and a reliability of the access device may be affected.

SUMMARY

According to an exemplary embodiment, a device may include: a first-type semiconductor layer having a first dopant; a third-type semiconductor layer formed on the first-type semiconductor layer; a second-type semiconductor layer formed on the third-type semiconductor layer, the second-type semiconductor layer having a second dopant that is different than the first dopant; a first counter-doping layer interposed between the first-type semiconductor layer and the third-type semiconductor layer, the first counter-doping layer having a dopant that is a counter-dopant to the first dopant; and a second counter-doping layer interposed between the third-type semiconductor layer and the second-type semiconductor layer, the second counter-doping layer having a dopant that is a counter-dopant to the second dopant.

According to an exemplary embodiment, a method may include: forming a silicon layer on a semiconductor substrate; doping the silicon layer with a first-type ion to form a first-type semiconductor layer; doping the silicon layer with a counterion to the first-type ion, to form a first counter-doping layer in contact with the first-type semiconductor layer; doping the silicon layer with a counterion to a second-type ion, which is different than the first-type ion, to form a second counter-doping layer separated from the first counter-doping layer by a certain distance; and doping the silicon layer with the second-type ion to form a second-type semiconductor layer in contact with the second counter-doping layer.

According to an exemplary embodiment, a method may include: forming, from a base layer, a first-type semiconductor layer, doped with a first-type ion, on a semiconductor substrate; forming, from the base layer, a first counter-doping layer, doped with a counterion to the first-type ion, on the first-type semiconductor layer; forming, from the base layer, a third-type semiconductor layer on the first counter-doping layer; forming, from the base layer, a second counter-doping layer, doped with a counterion to a second-type ion, on the third-type semiconductor layer; and forming, from the base layer, a second-type semiconductor layer, doped with the second-type ion, on the second counter-doping layer.

According to an exemplary embodiment, a device may include: a word line formed in a semiconductor substrate; an access device electrically connected to the word line; and a resistive memory device electrically connected to the access device, the access device including a first-type semiconductor layer, having a first dopant, connected to the word line; a third-type semiconductor layer formed on the first-type semiconductor layer; a second-type semiconductor layer, having a second dopant that is different than the first dopant, formed on the third-type semiconductor layer and connected to the resistive memory device; a first counter-doping layer interposed between the first-type semiconductor layer and the third-type semiconductor layer, the first counter-doping layer having a dopant that is a counter-dopant to the first dopant; and a second counter-doping layer interposed between the third-type semiconductor layer and the second-type semiconductor layer, the second counter-doping layer having a dopant that is a counter-dopant to the second dopant.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
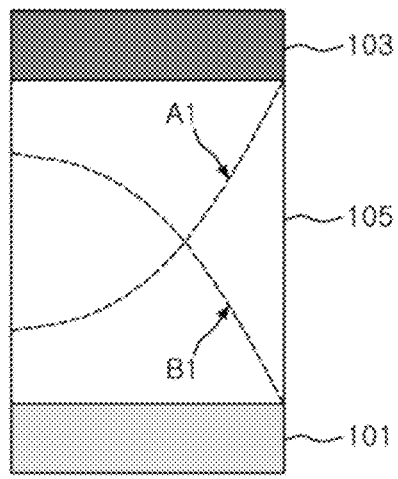
FIG. 1 is a view illustrating a structure of a conventional access device.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being"on" another layer or substrate, it can be directly on the other or substrate, or intervening layers may also be present.

Figure 2:
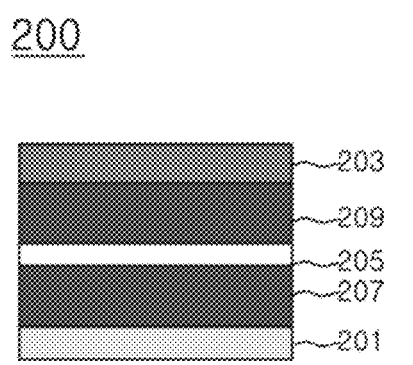
FIG. 2 is a view illustrating a structure of an access device according to an exemplary embodiment.

FIG. 2 is a view illustrating a structure of an access device according to an exemplary embodiment.

Referring to FIG. 2, an access device 200 according to an exemplary embodiment may include a first-type semiconductor layer 201, a third-type semiconductor layer 205 formed on the first-type semiconductor layer 201, a second-type semiconductor layer 203 formed on the third-type semiconductor layer 205, a first counter-doping layer 207 interposed between the first-type semiconductor layer 201 and the third-type semiconductor layer 205, and a second counter-doping layer interposed between the third-type semiconductor layer 205 and the second-type semiconductor layer 203.

In one exemplary embodiment, the first-type semiconductor layer 201 may be, for example, a semiconductor layer doped with a P+ type ion, while the second-type semiconductor layer 203 may be a semiconductor layer doped with an N+ type ion. Further, the first counter-doping layer 207 may be a layer doped with an N− type ion and the second counter-doping layer 209 may be a layer doped with a P− type ion.

In an exemplary embodiment, the first-type semiconductor layer 201 may be, for example, a semiconductor layer doped with an N+ type ion. The second-type semiconductor layer 203 may be formed by doping a P+ type ion. The first counter-doping layer 207 and the second counter-doping layer 209 may be formed by doping a P− type ion and an N− type ion, respectively.

The first-type semiconductor layer 201, doped with an N+ type ion, may be formed by doping a dopant based on a dopant-profile tunable level of a diode, for example, in a range of 1E19 atoms/cm$^3$ to 1E21 atoms/cm$^3$ through an in-situ doping or an ion implantation method.

A thickness and ion concentration in the first counter-doping layer 207, doped with a P− ion, may be determined based on a dopant profile determined by a thermal effect in a subsequent process and a diode structure and the first counter-doping layer 207 may be formed by an in-situ doping or an ion implantation method.

A thickness and ion concentration in the second counter-doping layer 209, doped with a N− ion, may be determined based on a dopant profile diffused from the second-type semiconductor layer to be formed in a subsequent process. These condcounter-doping layer 209 may be formed by an in-situ doping or an ion implantation method. Preferably, the second counter-doping layer may be formed by an in-situ doping method, considering an effect due to dopant diffusion into the third-type semiconductor layer 205, as described below.

The access device 200 can offset, via the first counter-doping layer 207, a contribution of dopant diffused from the first-type semiconductor layer 201 to the third-type semiconductor layer 205, and can offset, via the second counter-doping layer 209, a contribution of dopant diffused from the second-type semiconductor layer 203 to the third-type semiconductor layer 205. Therefore, an intrinsic doping concentration in a junction portion, that is, in the third-type semiconductor layer 205, is reduced to obtain a reduction effect in the junction concentration and thus, the current leakage of the diode can be easily suppressed.

The semiconductor layers 201, 203, 205, 207, and 209 may be formed by continuously depositing silicon layers and injecting a dopant into the respective layers. The silicon layers may include any one of a polysilicon layer, a single crystalline silicon layer, or a silicon germanium (SiGe) layer. In an exemplary embodiment, the semiconductor layers 201, 203, 205, 207, and 209 may be formed by repeatedly performing deposition and doping of silicon layers. The silicon layers may include any one of a polysilicon layer, a single crystalline silicon layer, or a silicon germanium (SiGe) layer. Regardless of the method of forming the semiconductor layers, at least one among the semiconductor layers may be formed of a silicon layer doped with germanium (Ge) or carbon (C).

Further, an exemplary access device may be formed by forming and patterning the respective layers or by forming a hole in a diode formation region and forming a diode in the hole. When the diode is formed in the hole, the silicon layer may be formed by a selective epitaxial growth method.

While depositing the respective semiconductor layers, a process of activating the dopant by performing a heat treatment process may be performed.

A method of fabricating the access device 200 illustrated in FIG. 2 will be described with reference to FIGS. 3 to 13.

FIGS. 3 to 13 are views illustrating a method of fabricating an exemplary semiconductor memory device. The exemplary semiconductor memory device may be a PCRAM or a ReRAM, but the exemplary semiconductor memory device is not limited thereto.

Figure 3:
FIGS. 3 to 10 are views illustrating a method of fabricating a semiconductor memory device according to an exemplary embodiment.

First, a semiconductor substrate (not shown), in which a bottom structure is formed, is provided. Here, the bottom structure may include a word line 211 as shown in FIG. 3. The word lines 211 are electrically isolated from each other by an insulating layer 213. The word line 211 may be formed using a low resistance metal material such as tungsten (W).

Figure 4:
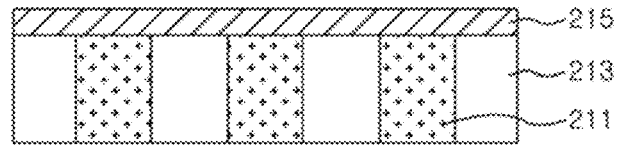

As shown in FIG. 4, a barrier metal layer 215 may be formed on the semiconductor substrate in which the bottom structure is formed. The barrier metal layer 215 prevents ions doped in an access device (to be formed in a subsequent process) from being diffused into the word lines 211 and forms an ohmic contact structure with the access device. The barrier metal layer may be omitted.

Figure 5:
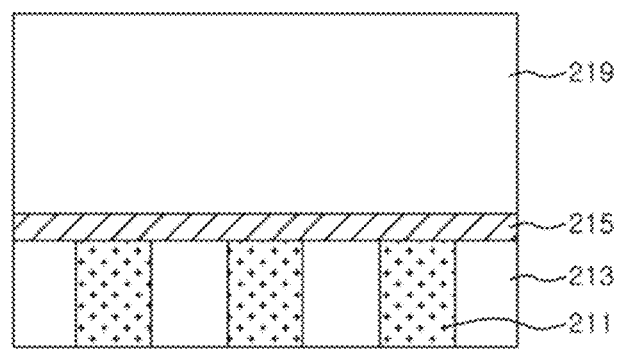

As shown in FIG. 5, a silicon layer 219 is formed on the semiconductor substrate in which the barrier metal layer 215 may be formed. The silicon layer may be selected from a polysilicon layer, a single crystalline silicon layer, or a silicon germanium (Site) layer. Preferably, the silicon layer may be a silicon layer doped with germanium (Ge) or carbon (C). A thickness of the silicon layer 219 is determined by considering a height of the diode.

Figure 6:
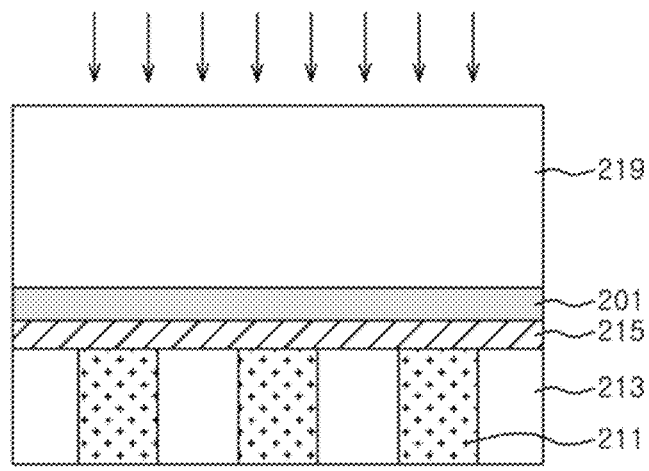

After the silicon layer 219 is formed, as shown in FIG. 6, a first-type ion is implanted into the silicon layer 219 to form a first-type semiconductor layer 201, which forms an ohmic contact with the barrier metal layer 215, to a predetermined height. Here, the first-type ion may be an N+ type ion or a P+ type ion. The N+ type ion may be doped in a doping-profile tunable level of the diode, for example, in a range of 1E19 atoms/cm$^3$ to 1E21 atoms/cm$^3$.

Figure 7:
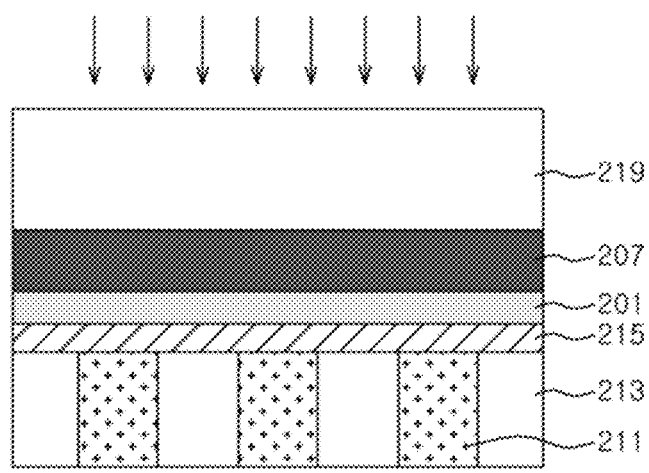

As shown in FIG. 7, a counter-doping with respect to the first-type ion is performed to form, to a predetermined height, a first counter-doping layer 207 in contact with the first-type semiconductor layer 201. For example, when the first-type semiconductor layer 201 is formed by doping an N+ type ion, the first counter-doping layer 207 is formed by doping a P− type ion. A thickness and dopant concentration in the first counter-doping layer 207 may be determined according to a dopant profile determined according to a subsequent heat treatment process and a diode design.

Figure 8:
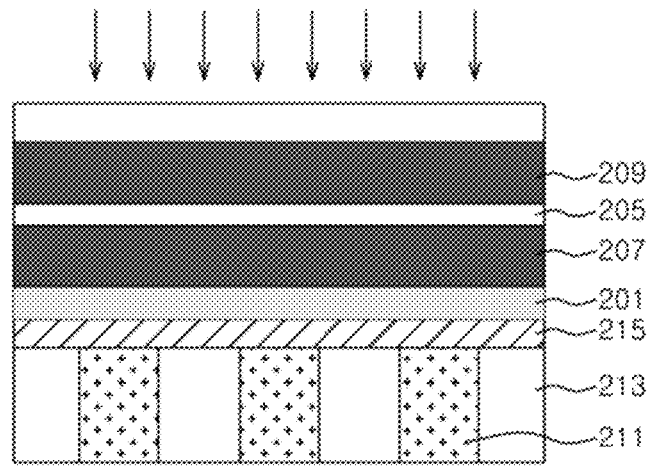

As shown in FIG. 8, a second counter-doping layer 209 is formed. The second counter-doping layer 209 is formed by doping a counter ion with respect to a second-type semiconductor layer (203 of FIG. 9—to be formed in a subsequent process) and is formed to be spaced from the first counter-doping layer 207 by a predetermined height. Further, a thickness and dopant concentration in the second counter-doping layer 209 may be determined according to a dopant profile determined according to a subsequent heat treatment process and a diode design.

A portion of the silicon layer 219, corresponding to the spaced height between the first counter-doping layer 207 and the second counter-doping layer 209, serves as a third-type semiconductor layer 205.

Figure 9:
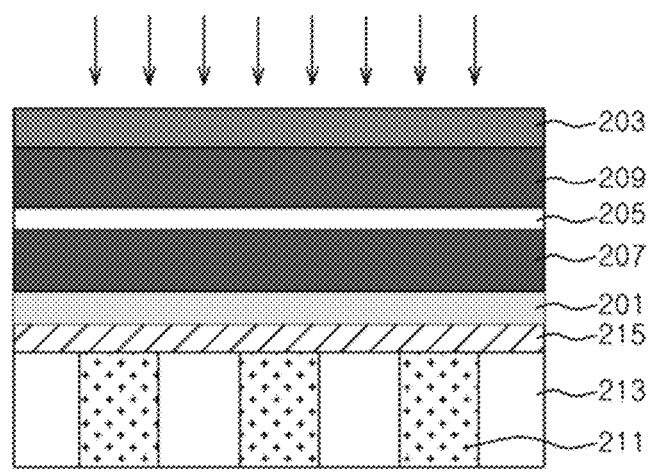
Figure 10:
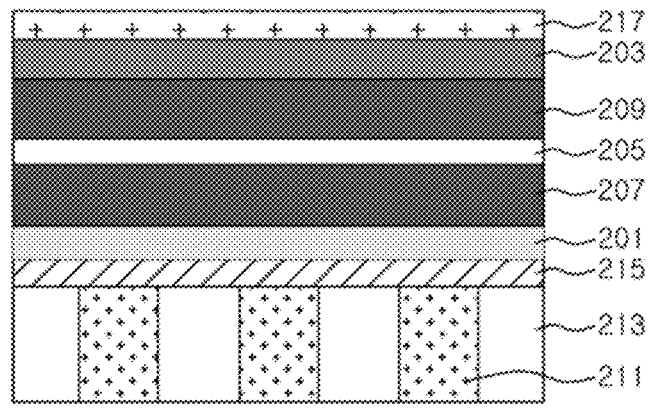

As shown in FIG. 9, a second-type ion is injected to transform an upper portion of the silicon layer to the second-type semiconductor layer 203. Here, when the first-type semiconductor layer 201 is a semiconductor layer doped with an N+ type ion, the second-type ion may be a P+ type ion. The second counter-doping layer 209 may be formed by doping an N− type ion. Alternatively, when the first-type semiconductor layer 201 is a semiconductor layer doped with a P+ type ion, the second-type ion may be an N+ type ion. The second counter-doping layer 209 may be formed by doping a P− type ion.

A heat treatment process is performed after the access device, that is, a diode, is formed as described above and as shown in FIG. 10. An electrode layer 217 is formed on the semiconductor substrate in which the access device is formed. Here, the electrode layer 217 may serve as one electrode of a resistive memory device (to be formed in a subsequent process).

The heat treatment process may be a rapid thermal annealing process, such as a spike annealing, a flash annealing, or a laser annealing. The diffusion profile of the dopant may be controlled by the heat treatment process.

In FIGS. 3 to 9, the method of fabricating the access device, including the first-type semiconductor layer 201, the first counter-doping layer 207, the third-type semiconductor layer 205, the second counter-doping layer, and the second-type semiconductor layer 203, by forming the silicon layer and controlling the ion implantation depth, has been described. The silicon layer may be formed using any one of a low pressure chemical vapor deposition (LPCVD) method, very low pressureCVD (VLPCVD) method, a plasma-enhanced CVD (PECVD) method, a ultrahighvacuumCVD (UH-VCVD) method, a rapidthermalCVD (RTCVD) method, an atmospherepressureCVD (APCVD) method, a molecular beam epitaxy (MBE) method, a physical vapor deposition (PVD) method, or a gasclusterion beam method.

Alternatively, the access device may be formed by patterning the semiconductor layers in a pillar-type shape after forming the second-type semiconductor layer as shown in FIG. 9. Alternatively, the access device may be formed in a hole previously formed in the semiconductor substrate via processes illustrated in FIGS. 3 to 9.

Figure 11:
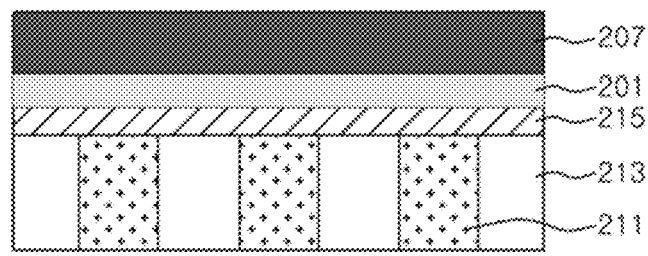
FIGS. 11 to 13 are views illustrating a method of fabricating a semiconductor memory device according to another exemplary embodiment.
Figure 12:
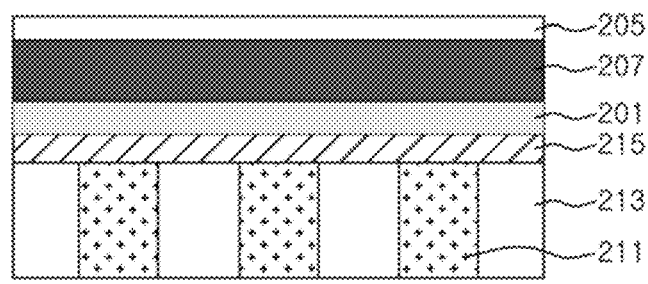
Figure 13:
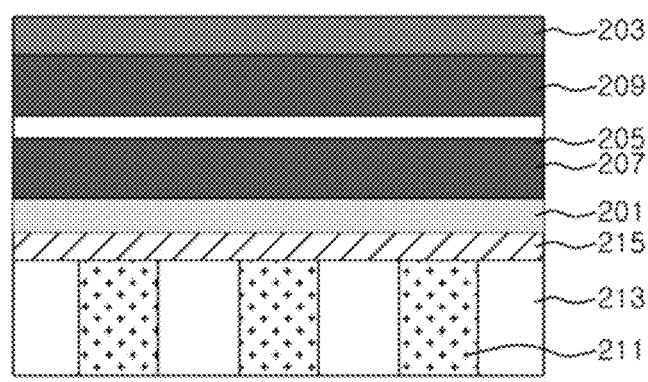

FIGS. 11 to 13 illustrate a method of fabricating a semiconductor memory device according to an exemplary embodiment.

A barrier metal layer 215 is formed on a substrate (not shown), in which a bottom structure including a word line is formed as illustrated in FIG. 4. As shown in FIG. 11, a first-type semiconductor layer 201 and a first counter-doping layer 207 are sequentially stacked.

Specifically, first, the first-type semiconductor layer 201 is formed on the barrier metal layer 215. The first-type semiconductor layer 201 may be formed by doping a first-type ion. The first-type semiconductor layer 201 may be formed using an in-situ doping method, an ion implantation method, an ex-situ doping method, or the like. The first-type ion may be an N+ type ion or a P+ type ion. The N+ type ion may be doped in a doping-profile tunable level of the diode, for example, in a range of 1E19 atoms/cm$^3$ to 1E21 atoms/cm$^3$.

The first counter-doping layer 207 may be formed using a counter ion with respect to the first-type ion doped in the first-type semiconductor layer 201 and a thickness and concentration of the first counter-doping layer 207 may be determined according to a dopant profile determined by a subsequent heat treatment process and a diode design. For example, when the first-type semiconductor layer 201 is a semiconductor layer doped with an N+ type ion, the first counter-doping layer may be a semiconductor layer doped with a P− type ion.

As shown in FIG. 12, a third-type semiconductor layer 205 is formed on the first counter-doping layer 207. The third-type semiconductor layer 205 may be a high resistance region, for example, an intrinsic semiconductor layer.

As shown in FIG. 13, a second counter-doping layer 209 and a second-type semiconductor layer 203 are sequentially formed on the third-type semiconductor layer 205.

Specifically, the second counter-doping layer 209 may be formed by doping a counter ion with respect to an ion doped in the second-type semiconductor layer and a thickness and concentration in the second counter-doping layer 209 may be determined according to a dopant profile determined by a subsequent heat treatment process and a diode design.

For example, when the first-type semiconductor layer 201 is a semiconductor layer doped with an N+ type ion, the second-type ion may be a P+ type ion and the second counter-doping layer 209 may be formed by doping an N− type ion. Alternatively when the first-type semiconductor layer 201 is a semiconductor layer doped with a P+ type ion, the second-type ion may be an N+ type ion and the second counter-doping layer 209 may be formed by doping a P− type ion.

In FIGS. 11 to 13, the silicon layer, from which the first-type, the second-type, and the third-type silicon layers are formed, may be selected from a polysilicon layer, a single crystalline silicon layer, or a silicon germanium (SiGe) layer. Preferably, the silicon layer may be a silicon layer doped with germanium (Ge) or carbon (C). At least one of the semiconductor layers may be formed of a silicon germanium (SiGe) layer.

The silicon layer may be formed using any one of a LPCVD method, a VLPCVD method, a PECVD method, a UHVCVD method, a RTCVD method, an APCVD method, a MBE method, a PVD method, or a gas cluster ion beam method.

Further, the access device may be formed by patterning the semiconductor layers in a pillar-type shape after forming the second-type semiconductor layer as shown in FIG. 13. Alternatively, the access device may be formed in a hole previously formed in the semiconductor substrate via processes illustrated in FIGS. 11 to 13.

As described above, an exemplary access device may include the first counter-doping layer 207 formed on the first-type semiconductor layer 201 and the second counter-doping layer 209 formed below the second-type semiconductor layer. The above-described structure can offset via the first counter-doping layer 207, a contribution of dopant diffused from the first-type semiconductor layer 201 to the third-type semiconductor layer 205, and can offset, via the second counter-doping layer 209, a contribution of dopant diffused from the second-type semiconductor layer 203 to the third-type semiconductor layer 205. Therefore, a reduction effect of a doping concentration in the junction portion between the first and second-type semiconductor layers 201 and 203 is obtained and thus, the current leakage of the diode can be easily suppressed.

Figure 14:
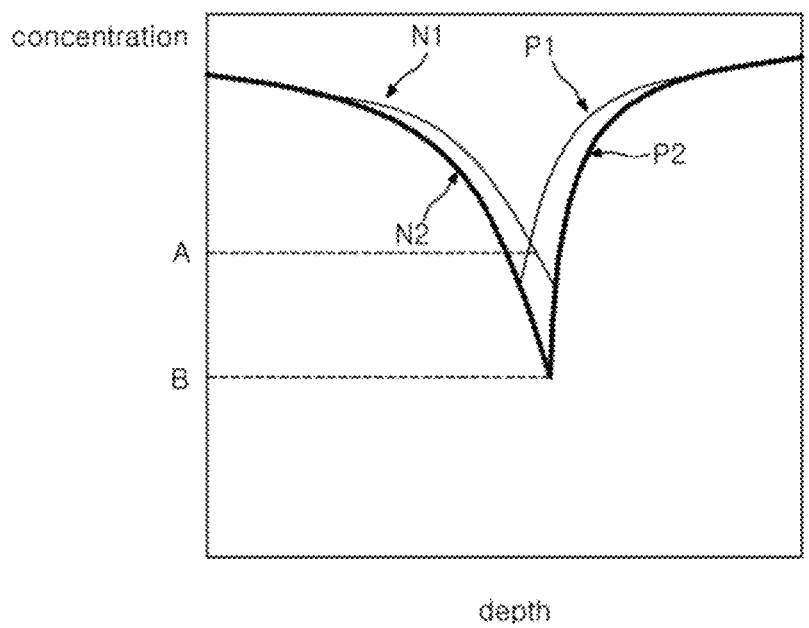
FIG. 14 is a view explaining a dopant diffusion profile according to a structure of an exemplary access device.

FIG. 14 is a view explaining an exemplary dopant diffusion profile.

A doping concentration according to the first-type ion and the second-type ion, in a junction portion between the first-type semiconductor layer and the second-type semiconductor layer, will be described.

In the conventional access device 100 illustrated in FIG. 1, it can be seen that the ion concentration A is high in the junction portion due to diffusion of the first-type ion N1 and the second-type ion P1.

In the access device 200 in the exemplary embodiment, it can be seen that the concentrations B of the first-type ion N2 and the second-type ion P2 are reduced in the junction portion.

That is, the ions diffused from the first-type and second-type semiconductor layers 201 and 203 are offset by introduction of the first and second counter-doping layers 207 and 209. Thus, the degree of ion diffusion into the third-type semiconductor layer 205, which is the junction portion, is lowered. Therefore, the height of the third-type semiconductor layer 205 may be lowered and, as a result, the access device may be formed to a lower height.

As described above, as the access device can be miniaturized, the overall reduction rate of the semiconductor memory device can be increased.

Figure 15:
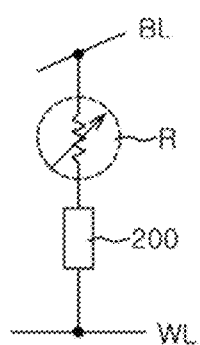
FIGS. 15 and 16 are views explaining configurations of resistive memory cell arrays according to an exemplary embodiment.
Figure 16:
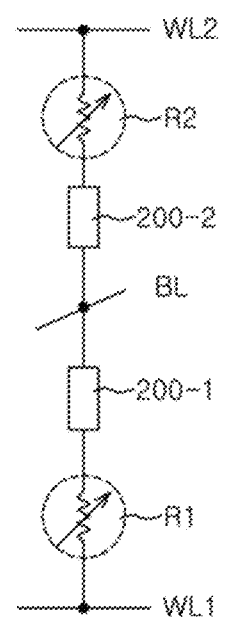

FIGS. 15 and 16 are views explaining configurations of memory cell arrays according to an exemplary embodiment.

FIG. 15 illustrates a configuration of a memory cell array including memory cells between a plurality of bit lines BL and a plurality of word lines WL.

As illustrated in FIG. 15, a memory cell array may be configured by forming a resistive device R and an access device 200 between the bit line BL and the word line WL. Here, the access device 200 may be formed using the access device illustrated in FIG. 2.

FIG. 16 illustrates a memory cell array configured in a crossbar array type.

In the crossbar type memory cell array unit memory cells may be formed to have a symmetrical structure based on a bit line BL. Further, the unit memory cells have a structure in which resistive devices R1 and R2 and access devices 200-1 and 200-2 are connected in series and the access device illustrated in FIG. 2 may be used as the access devices 200-1 and 200-2.

In the memory cell arrays illustrated in FIGS. 15 and 16, the access device illustrated in FIG. 2 may be used as the access device for selecting the resistive device. The access device can offset the dopant concentration in the junction portion by the first counter-doping layer and the second counter-doping layer interposed between the first-type semiconductor layer and the second-type semiconductor layer to effectively lower the height of the access device.

The reduction in the height allows the height of the semiconductor memory device to be reduced. Thus, a semiconductor memory device with high degree of integration and a small size, may be created without a loss in high performance.

The above exemplary embodiments are illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method of fabricating an access device, the method comprising:
    forming a silicon layer on a semiconductor substrate;
    doping the silicon layer with a first-type ion to form a first-type semiconductor layer directly over the semiconductor substrate to a first predetermined height;
    doping the silicon layer with a first counter ion to form a first counter-doping layer directly over the first-type semiconductor layer to a second predetermined height, wherein the first counter ion has different conductivity from the first-type ion;
    doping the silicon layer with a second counter ion to form a second counter-doping layer over the first counter-doping layer to a third predetermined height, wherein the second counter-doping layer is separated from the first counter-doping layer, wherein the second counter ion has the same conductivity as the first-type ion; and
    doping the silicon layer with a second-type ion to form a second-type semiconductor layer directly over the second counter-doping layer, wherein the second-type ion has different conductivity from the first-type ion.

2. The method of claim 1, wherein the silicon layer includes a polysilicon layer, a single crystalline silicon layer, a silicon germanium (SiGe) layer, or a combination thereof.

3. The method of claim 2, wherein the silicon layer is a germanium (Ge) or a carbon (C)-doped silicon layer.

4. The method of claim 1, wherein the silicon layer between the first counter-doping layer and the second counter-doping layer serves as a third type semiconductor layer.

5. The method of claim 1, further comprising:
    performing a heat treatment process after forming the second-type semiconductor layer.

6. A method of fabricating an access device, the method comprising:
    forming a first-type semiconductor layer doped with a first-type ion and provided directly over a semiconductor substrate to a first predetermined height;
    forming a first counter-doping layer doped with a first counter ion and provided directly over the first-type semiconductor layer to a second predetermined height, wherein the first counter ion has different conductivity from the first-type ion;
    forming a third-type semiconductor layer directly over the first counter-doping layer to a third predetermined height;
    forming a second counter-doping layer doped with a second counter ion and provided directly over the third-type semiconductor layer to a fourth predetermined height, wherein the second counter ion has the same conductivity as the first-type ion; and
    forming a second-type semiconductor layer doped with a second-type ion and provided directly over the second counter-doping layer, wherein the second-type ion has different conductivity from the first-type ion.

7. The method of claim 6, wherein each of the first-type semiconductor layer, the second-type semiconductor layer, the third-type semiconductor layer, the first counter-doping layer, and the second counter-doping layer is formed using a polysilicon layer, a single crystalline silicon layer, or a silicon germanium (SiGe) layer as a base layer.

8. The method of claim 7, wherein the base layer is a germanium (Ge) or a carbon (C)-doped silicon layer.

9. The method of claim 6, further comprising:
    performing a heat treatment process after forming the first-type semiconductor layer, after forming the second-type semiconductor layer, after forming the third-type semiconductor layer, after forming the first counter-doping layer, or after forming the second counter-doping layer.

* * * * *